(12) United States Patent
Zhao et al.

(10) Patent No.: US 12,387,906 B2
(45) Date of Patent: Aug. 12, 2025

(54) COIL STRUCTURE FOR GENERATING PLASMA AND SEMICONDUCTOR EQUIPMENT

(71) Applicant: BEIJING NAURA MICROELECTRONICS EQUIPMENT CO., LTD., Beijing (CN)

(72) Inventors: Jinrong Zhao, Beijing (CN); Song Wang, Beijing (CN); Gang Wei, Beijing (CN); Jinji Xu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 89 days.

(21) Appl. No.: 18/577,036

(22) PCT Filed: Jul. 6, 2022

(86) PCT No.: PCT/CN2022/104068
§ 371 (c)(1),
(2) Date: Jan. 5, 2024

(87) PCT Pub. No.: WO2023/280196
PCT Pub. Date: Jan. 12, 2023

(65) Prior Publication Data
US 2024/0339296 A1 Oct. 10, 2024

(30) Foreign Application Priority Data
Jul. 9, 2021 (CN) .......................... 202110776478.3

(51) Int. Cl.
*H01J 37/32* (2006.01)

(52) U.S. Cl.
CPC ..... *H01J 37/3211* (2013.01); *H01J 37/32119* (2013.01); *H01J 2237/3344* (2013.01)

(58) Field of Classification Search
CPC ............ H01J 37/3211; H01J 37/32119; H01J 2237/3344; H01J 37/321; H01J 2237/334;
(Continued)

(56) References Cited

U.S. PATENT DOCUMENTS

| | | | |
|---|---|---|---|
| 6,116,186 A * | 9/2000 | Li | H01J 37/32522 |
| | | | 204/298.37 |
| 2002/0121345 A1* | 9/2002 | Chen | C23C 16/507 |
| | | | 156/345.48 |

(Continued)

FOREIGN PATENT DOCUMENTS

| | | |
|---|---|---|
| CN | 101136279 A | 3/2008 |
| CN | 101515498 A | 8/2009 |

(Continued)

OTHER PUBLICATIONS

The World Intellectual Property Organization (WIPO) International Search Report for PCT /CN2022/104068 Aug. 25, 2022 6 Pages (including translation).

*Primary Examiner* — Abdullah A Riyami
*Assistant Examiner* — Syed M Kaiser
(74) *Attorney, Agent, or Firm* — ANOVA LAW GROUP, PLLC

(57) ABSTRACT

The present disclosure provides a coil structure for generating plasma and semiconductor processing equipment. The coil structure includes at least one coil set. The coil set includes a first sub-coil set and a second sub-coil set that are coaxially arranged. The first sub-coil set includes at least one first planar coil located in a first plane. The second sub-coil set includes at least one second planar coil located in a second plane parallel to the first plane. The first planar coil and the second planar coil are connected in series. An (Continued)

orthogonal projection of the second planar coil on the first plane is mirror-symmetric or mirror-asymmetric to the first planar coil. The coil structure for generating the plasma and the semiconductor processing equipment of the present disclosure compensate for the difference in the current distribution of the coil in the radial direction.

17 Claims, 15 Drawing Sheets

(58) Field of Classification Search
CPC .. H05H 1/46; H05H 1/4652; H01L 21/67115; H01L 21/67069
See application file for complete search history.

(56) References Cited

U.S. PATENT DOCUMENTS

| | | | | |
|---|---|---|---|---|
| 2004/0140778 A1* | 7/2004 | Petrin | ............... | H01J 37/32266 315/502 |
| 2008/0185284 A1* | 8/2008 | Chen | ................. | H01J 37/321 118/723 R |
| 2009/0004871 A1* | 1/2009 | Maeda | .............. | H01J 37/32082 257/E21.252 |
| 2015/0228456 A1* | 8/2015 | Ye | .................... | H01J 37/32669 315/111.51 |
| 2016/0293382 A1* | 10/2016 | Sato | ................. | H01J 37/32174 |
| 2018/0122619 A1 | 5/2018 | Uhm et al. | | |
| 2020/0105503 A1* | 4/2020 | Notomi | ................ | H01J 37/3211 |
| 2023/0260751 A1* | 8/2023 | Zhao | ........................ | H01F 5/04 156/345.48 |

FOREIGN PATENT DOCUMENTS

| | | | | |
|---|---|---|---|---|
| CN | 102598201 | A | 7/2012 | |
| CN | 111192752 | A | 5/2020 | |
| CN | 111785605 | A * | 10/2020 | ............... H01F 5/00 |
| EP | 1608000 | A2 | 12/2005 | |
| JP | 2010501123 | A | 1/2010 | |
| JP | 2015026464 | A | 2/2015 | |
| KR | 20090036125 | A | 4/2009 | |
| TW | 201234933 | A | 8/2012 | |
| WO | 2020146034 | A1 | 7/2020 | |

* cited by examiner

COIL STRUCTURE FOR GENERATING PLASMA AND SEMICONDUCTOR EQUIPMENT

CROSS-REFERENCE TO RELATED APPLICATIONS

This application is a national phase entry under 35 U.S.C. § 371 of International Application No. PCT/CN2022/104068, filed on Jul. 6, 2022, which claims priority to Chinese Application No. 202110776478.3 filed on Jul. 9, 2021, the entire contents of both of which are incorporated herein by reference.

TECHNICAL FIELD

The present disclosure generally relates to the semiconductor manufacturing field and, more particularly, to a coil structure for generating plasma and semiconductor equipment.

BACKGROUND

An inductively coupled plasma (ICP) source is a commonly used plasma source for dry etching and thin film deposition in the semiconductor field. The ICP source generates plasma by passing a high-frequency current through a coil to generate a high-frequency electromagnetic field to excite the gas. The ICP source can operate at a relatively low chamber pressure. The density of the plasma is high, and the damage to the workpiece is small. With feature sizes continuing to shrink, the challenges in the processing process have become more critical. One essential requirement is the consistency of the plasma source. For the ICP source, the distribution of the coil plays a critical role in the etching morphology and uniformity. The uniformity and symmetry of the radial and angular distribution of the coil current need to be continuously optimized to enhance the capability of plasma processing equipment in manufacturing highly integrated devices.

FIG. 1 illustrates a schematic diagram of a coil structure in the existing technology. FIG. 2 illustrates a schematic diagram of an electromagnetic field in the existing technology. As shown in FIG. 1 and FIG. 2, the coil structure includes an inner coil set 11 and an outer coil set 12. The inner coil set 11 and the outer coil set 12 each is formed by two planar coils. The two planar coils are arranged symmetrically rotating 180° relative to a radial direction. An orthogonal projection of each pane coil on the radial cross-section of the planar coil is involute, and a coil turn number is 1.5. Outer ends of the two planar coils of each of the inner coil set 11 and the outer coil set 12 at the outer turn are connected in parallel and are electrically connected to an output end of an adapter 13, and inner ends at the inner turn are connected in parallel and electrically connected to an input end of the adapter 13.

As shown in FIG. 2, taking the shape of a single planar coil as an involute shape with 1.5 turns as an example, the geometric distribution of the involute on left and right parts on both sides of a dashed line in FIG. 2 is uneven, and the radial distribution is also uneven, which causes the left and right distribution of the electromagnetic field to be asymmetric. Meanwhile, the radial distribution of the involute is uneven. Thus, the current of the coil at left, right, and in the radial direction is different, which causes the distribution of the density of the free radicals and ions of the plasma to be uneven in the processing process. That is, the distribution of the plasma is uneven. Thus, the etching on the wafer is uneven, which affects the etching quality or efficiency negatively.

SUMMARY

The present disclosure is intended to solve one of the technical problems in the existing technology and provide a coil structure for generating the plasma and semiconductor equipment configured to compensate for the difference in current distribution of a coil in a radial direction to improve distribution uniformity of coupling energy generated below the coil in the radial direction to improve distribution uniformity of density of free radicals and ions of the plasma.

To achieve the above purpose, the present disclosure provides a coil structure configured to generate plasma in semiconductor processing equipment. The coil structure includes at least one coil set. The coil set includes a first sub-coil set and a second sub-coil set that are coaxially arranged. The first sub-coil set includes at least one first planar coil located in a first plane. The second sub-coil set includes at least one second planar coil located in a second plane parallel to the first plane. The first planar coil and the second planar coil are connected in series. An orthogonal projection of the second planar coil on the first plane is mirror-symmetric or mirror-asymmetric to the first planar coil.

In some embodiments, the first sub-coil set includes a plurality of first planar coils, the plurality of first planar coils have a same shape and are arranged at intervals from each other, first ends of the plurality of first planar coils are uniformly distributed along a circumferential direction of the coil set, and second ends of the plurality of first planar coils are uniformly distributed along the circumferential direction of the coil set.

The second sub-coil set includes a plurality of second planar coils, the plurality of second planar coils have a same shape and are arranged at intervals from each other, first ends of the plurality of second planar coils are uniformly distributed along a circumferential direction of the coil set, and second ends of the plurality of second planar coils are uniformly distributed along the circumferential direction of the coil set.

The plurality of first planar coils are in a one-to-one correspondence with the plurality of second planar coils, the first ends of the plurality of first planar coils are connected in parallel, the first ends of the plurality of second planar coils are connected in parallel, the second ends of the plurality of first planar coils are connected to the second ends of the plurality of second planar coils in series in a one-to-one correspondence.

In some embodiments, an axial distance between the first sub-coil set and the second sub-coil set is less than or equal to a determined axial distance, and the orthogonal projection of the second-planar coil on the first plane is mirror-symmetric to the first planar coil; or The axial distance between the first sub-coil set and the second sub-coil set is greater than the determined axial distance, and the orthogonal projection of the second planar coil is mirror-asymmetric to the first planar coil.

In some embodiments, the determined axial distance is 5 mm.

In some embodiments, the axial distance between the first sub-coil set and the second sub-coil set ranges from greater than or equal to 4 mm to less than or equal to 20 mm.

In some embodiments, shapes of the first-planar coil and the second-planar coil are both involute shapes.

In some embodiments, the orthogonal projection of the second planar coil on the first plane is mirror-asymmetric to the first planar coil.

At least one of a starting radius, a rotation number, or a radius change rate in involute curves of the first planar coil and the second planar coil connected to the first planar coil in series is different.

In some embodiments, a rotation number of an involute curve of one of the first planar coil and the second planar coil connected to the first planar coil in series is greater than or smaller than a rotation number of an involute curve of the other one of the first planar coil and the second planar coil connected to the first planar coil in series to increase or reduce an amplitude of the coupling energy generated below the first planar coil and the second planar coil connected to the first planar coil in series; and/or a radius change rate of the involute curve of one of the first planar coil and the second planar coil connected to the first planar coil in series is greater than or smaller than a radius change rate of the involute curve of the other one of the first planar coil and the second planar coil connected to the first planar coil in series to increase or reduce a density amplitude of the coupling energy generated below the first planar coil and the second planar coil connected to the first planar coil in series; and/or a starting radius of the involute curve of one of the first planar coil and the second planar coil connected to the first planar coil in series is greater than or smaller than a starting radius of the involute curve of the other one of the first planar coil and the second planar coil connected to the first planar coil in series to cause a peak value of the coupling energy generated below the first planar coil and the second planar coil connected to the first planar coil in series to move away from or close to an axis of the coil set along a radial direction of the coil set.

In some embodiments, a change range of the rotation number of the involute curve of one of the first planar coil and the second planar coil connected to the first planar coil in series relative to the rotation number of the involute curve of the other one of the first planar coil and the second planar coil connected to the first planar coil in series is greater than or equal to −5% and smaller than or equal to +12%.

A change range of the radius change rate of the involute curve of one of the first planar coil and the second planar coil connected to the first planar coil in series relative to the radius change rate of the involute curve of the other one of the first planar coil and the second planar coil connected to the first planar coil in series is greater than or equal to −10% and smaller than or equal to +30%.

A change range of the starting radius of the involute curve of one of the first planar coil and the second planar coil connected to the first planar coil in series relative to the starting radius of the involute curve of the other one of the first planar coil and the second planar coil connected to the first planar coil in series is greater than or equal to −10% and smaller than or equal to +10%.

In some embodiments, N first planar coils are provided, N is an even number greater than or equal to 2, the N first planar coils are divided into N/2 first coil pairs along the circumferential direction of the coil set, each first coil pair includes two neighboring first planar coils, and a first extension segment connects between first ends of the two neighboring first planar coils to connect the first ends in parallel, and first extension segments of the N/2 first coil pairs are connected in parallel.

N second planar coils are provided, the N second planar coils are divided into N/2 second coil pairs along the circumferential direction of the coil set, each second coil pair includes two neighboring second planar coils, and a second extension segment connects between first ends of the two neighboring second planar coils to connect the first ends in parallel, and second extension segments of the N/2 second coil pairs are connected in parallel In some embodiments, N is greater than or equal to 6 and less than or equal to 10.

In some embodiments, a connection segment connects between a second end of each first planar coil and a second end of a corresponding second planar coil to connect the second ends in series, and an extension direction of the connection segment is parallel to an axis of the coil set.

In some embodiments, the coil set includes a plurality of coil sets, and the plurality of coil sets have different sizes and are nested with each other.

As another technical solution, the present disclosure further provides semiconductor processing equipment, including an RF source, a reaction chamber, and the coil structure of the present disclosure, wherein a dielectric window is arranged at the top of the reaction chamber, the coil structure is arranged above the dielectric window, and the RF source is configured to provide RF power to the coil structure.

In some embodiments, the coil structure adopts the coil structure according to any one of the coil structures.

The semiconductor processing equipment further includes a connection structure, the connection structure including a first connector and a second connector, wherein the first connector is electrically connected to the first ends of the plurality of first planar coils in the first sub-coil set, and the second connector is electrically connected to the first ends of the plurality of second planar coils in the second sub-coil set.

One of the first connector and the second connector is electrically connected to the input end of the RF source, and the other one of the first connector and the second connector is electrically connected to the output end of the RF source.

In some embodiments, the coil structure adopts the coil structure according to any one of the coil structures.

The first connector includes N/2 first connection bars, one end of each of the N/2 first connection bars is electrically connected to a first extension segment of the N/2 first coil pairs, the other end of each of the N/2 first connection bars converges and is electrically connected at a first height position above the first plane; the second connector includes N/2 second connection bars, one end of each of the N/2 second connection bars is electrically connected to a second extension segment of the N/2 second-planar coil pairs, and the other end of each of the N/2 second connection bars converges and is electrically connected at a second height position above the first plane, and a height difference exists between the second height position and the first height position.

In some embodiments, one end of each first connection bar is electrically connected to a midpoint of a corresponding first extension segment, and one end of each second connection bar is electrically connected to a midpoint of a corresponding second extension segment.

The present disclosure has the following beneficial effects.

The present disclosure provides the coil structure for generating plasma in the semiconductor processing equipment. The coil structure includes at least one coil set. The coil set includes a first sub-coil set and a second sub-coil set. The first sub-coil set includes at least one first planar coil located in a first plane. The second sub-coil set includes at least one second planar coil located in a second plane parallel to the first plane. The first planar coil and the second planar coil are connected in series. An orthogonal projection of the second planar coil on the first plane is mirror-symmetric or mirror-asymmetric to the first planar coil. By causing the orthogonal projection of the second planar coil on the first plane to be mirror-symmetric or mirror-asymmetric to the first planar coil, the magnetic fields and the electric fields of the first sub-coil set and the second sub-coil set can compensate to each other. That is, the total magnetic field and the total electric field formed by superimposing the magnetic fields and the electric fields generated by the first planar coil and the second planar coil can be mirror-symmetric to compensate for the difference in the current distribution of the coil in the radial direction to improve the distribution uniformity of the coupling energy generated below the coil in the radial direction to improve the distribution uniformity of the density of the free radicals and ions of the plasma.

By adopting the coil structure of the present disclosure, the semiconductor processing equipment of the present disclosure can compensate for the difference in the current distribution of the coil in the radial direction to improve the distribution uniformity of the coupling energy generated below the coil in the radial direction to improve the distribution uniformity of the density of the free radicals and ions of the plasma.

DETAILED DESCRIPTION OF THE EMBODIMENTS

To cause those skilled in the art to better understand the technical solution of the present disclosure, a coil structure for generating plasma in semiconductor process equipment and the semiconductor process equipment of the present disclosure are described in detail in conjunction with the accompanying drawings.

First Embodiment

The present embodiment provides a coil structure for generating plasma in semiconductor processing equipment. The semiconductor process equipment can be configured to perform etching processing on a wafer. The coil structure can be used as an upper electrode configured to excite the process gas in the reaction chamber to form the plasma.

The coil structure includes at least one coil set. The coil set can include a first sub-coil set and a second sub-coil set that are coaxially arranged. The first sub-coil set can include at least one first-planar coil located in a first plane. The first plane can be perpendicular to an axis of the coil set. The second sub-coil set can include at least one second planar coil located in a second plane parallel to the first plane. The first-planar coil and the second-planar coil can be connected in series. An orthogonal projection of the second planar coil on the first plane is mirror-symmetric or non-mirror-symmetric. The second plane can be located below the first plane where the first planar coil is located at a certain distance. That is, the second planar coil can be located below the first planar coil at a vertical distance.

The term "mirrored image" refers to that the shape of the orthogonal projection of the first-planar coil (hereinafter referred to as first projection A) on the first plane is the same or similar to the shape of the orthogonal projection of the second planar coil (hereinafter referred to as second projection B), but the arrangement is in opposite directions. In some embodiments, first projection A and second projection B each have front and back sides parallel to the first plane, and the shape of the front side of one of first projection A and second projection B is the same or similar to the shape of the back side of the other one of first projection A and second projection B. The term "symmetric" refers to that the shape of the front side of one of first projection A and second projection B has the same parameters as the shape of the back side of the other one of first projection A and second projection B. The term "non-symmetric" refers to that the shape of the front side of one of first projection A and second projection B is similar to the shape of the back side of the other one of first projection A and second projection B, but some parameters are different.

Figure 3A:
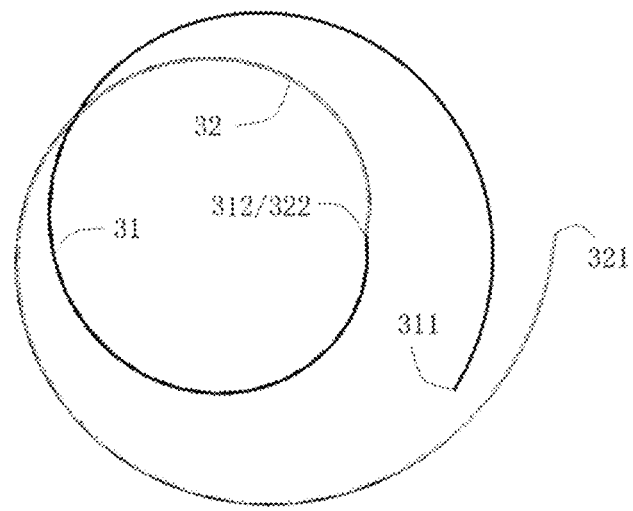
FIG. 3A illustrates a schematic diagram showing orthogonal projections of a single first planar coil of a first type and a second planar coil connected to the single first planar coil in series on a first plane according to a first embodiment of the present disclosure.
Figure 4:
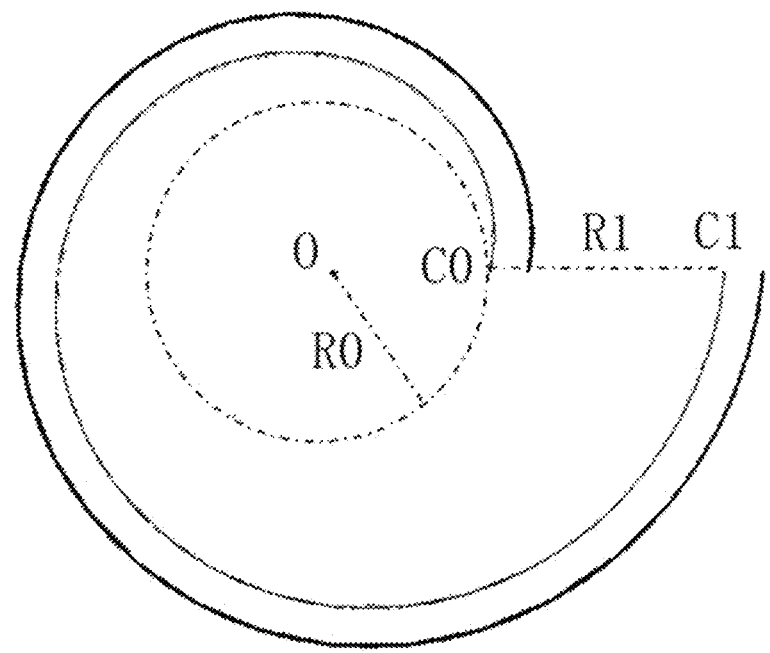
FIG. 4 illustrates a schematic diagram of parameters of an involute according to a first embodiment of the present disclosure.

For example, As shown in FIG. 3A, the shapes of the first planar coil and the second planar coil are involute. The shape of the first planar coil is a first involute curve 31, the shape of the second planar coil is a second involute curve 32. The orthogonal projection of the second involute curve 32 on the first plane is mirror non-symmetric with the first involute curve 31. In some embodiments, as shown in FIG. 4, a rotation center of the involute is point 0, a starting point of the involute is C0, a starting radius of the involute is R0, an ending point of the involute is C1, and an ending radius of the involute is R1. In some embodiments, at least one of the starting radius, a number of rotations, and a radius change rate can be different for the first involute curve 31 and the second involute curve 32 in FIG. 3A to achieve mirror non-symmetry.

Figure 3B:
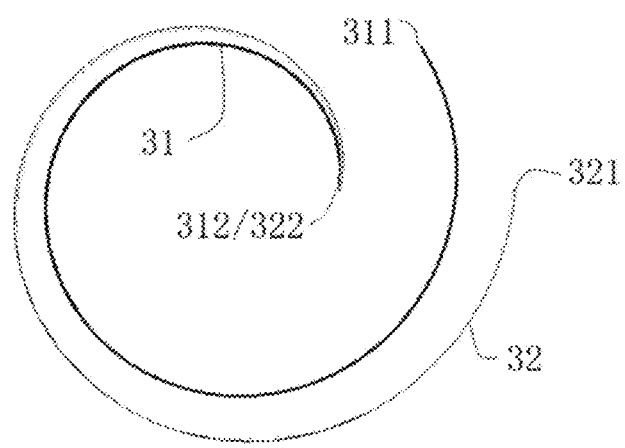
FIG. 3B illustrates a schematic diagram showing orthogonal projections of mirror images of the single first planar coil in FIG. 3A and the second planar coil connected to the single first planar coil in series on the first plane according to a first embodiment of the present disclosure.

For example, as shown in FIG. 3B, to facilitate comparison, the front side and the back side of one of the first involute curve 31 and the second involute curve 32 in FIG. 3A are flipped. That is, the shape of one of the first involute curve 31 and the second involute curve 32 in FIG. 3B is a mirrored shape. After comparison, the starting points of the first involute curve 31 and the second involute curve 32 overlap, and the starting radius of the first involute curve 31 and the second involute curve 32 are the same. The rotation number of the first involute curve 31 is greater than the rotation number of the second involute curve 32. The radius change rate of the first involute curve 31 is smaller than the radius change rate of the second involute curve 32. Thus, the first involute curve 31 and the second involute curve 32 have different rotation numbers and radius change rates to achieve mirror non-symmetry for the first involute curve 31 and the second involute curve 32.

In some embodiments, the second end 312 of the first planar coil can be connected in series with the second end 322 of the second planar coil to connect the first planar coil and the second planar coil in series.

By making the orthogonal projection of the second planar coil on the first plane mirror-symmetric or mirror-asymmetric to the first planar coil, magnetic fields and electric fields generated by the first planar coil and the second planar coil can compensate for each other. That is, the distribution of a total magnetic field and a total electric field formed by the superposition of the magnetic fields and electric fields generated by the first planar coil and the second planar coil is mirror-symmetric. Thus, the differences in the current distribution in the radial direction of the coil can be compensated to improve the uniformity of the distribution of the coupling energy generated by the coil below the coil. Thus, the uniformity of the distribution of the density of the free radicals and ions in the plasma in the radial direction can be enhanced.

In some embodiments, the shapes of the first planar coil and the second planar coil can be involute shape. For example, the involute shape can be a helical involute or a polygonal involute (such as a square), etc. Of course, in practical applications, the shapes of the first planar coil and the second planar coil can also be any other shapes, such as arc shapes.

The size of the axial distance between the first sub-coil set and the second sub-coil set can be determined based on the power output by the upper electrode power source. For example, when the power output by the upper electrode power source can be in a medium to low power range (generally <2000 W), the axial distance can be set within a smaller range. When the power output is a high power range (generally ≥2000 W), the axial distance can be set within a big range to avoid sparking between the first sub-coil set and the second sub-coil set because the first sub-coil set is too close to the second sub-coil set. However, the axial distance should not be too large, otherwise, the compensation for the difference in the current distribution can fail between the first sub-coil set and the second sub-coil set.

In some embodiments, the range of the axial distance between the first sub-coil set and the second sub-coil set can be greater than or equal to 4 mm and less than or equal to 20 mm. By setting the axial distance within the range, the sparking between the first sub-coil set and the second sub-coil set since the first sub-coil set is too close to the second sub-coil set can be avoided, and the compensation for the difference in the current distribution between the first sub-coil set and the second sub-coil set can be achieved.

In some embodiments, the axial distance can be 5 mm.

In some embodiments, if the axial distance between the first sub-coil set and the second sub-coil set is less than or equal to the axial distance (e.g., 5 mm), first projection A and second projection B can be mirror-symmetric. When the axial distance is small, first projection A and second projection B can be mirror-symmetric. Thus, the compensation for the difference in the current distribution between the first sub-coil set and the second sub-coil set can be achieved.

However, if the axial distance between the first sub-coil set and the second sub-coil set is greater than the axial distance, insufficient compensation can be provided. For this situation, first projection A and second projection B can be caused to be mirror-asymmetric to enhance the compensation effect. That is, by making the orthogonal projection of the second planar coil on the first plane mirror-asymmetric with the first planar coil, the insufficient compensation can be compensated by using the difference in some parameters of the orthogonal projection of the second planar coil on the first plane and the first planar coil to ensure the distribution of the total magnetic field and the total electric field mirror-symmetric.

It should be noted that FIG. 3A and FIG. 3B only illustrate one way of the first planar coil and the second planar coil for causing first projection A and second projection B to achieve the mirror-asymmetric. However, the present disclosure is not limited to this. In practical applications, by causing at least one of the starting radius, the rotation number, and the radius change rate of the involutes of the first planar coil and the second planar coil connected to the first planar coil in series to be different, first projection A and second projection B can be mirror-asymmetric. Several situations of at least one of the starting radius, the rotation number, and the radius change rate of the involutes of the first planar coil and the second planar coil connected to the first planar coil in series being different are described as examples.

Figure 5A:
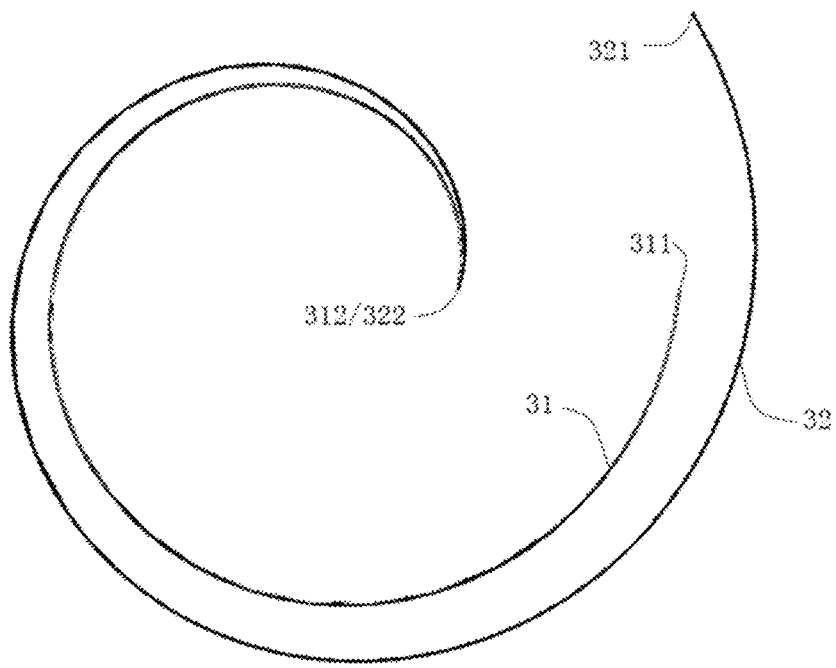
FIG. 5A illustrates a schematic diagram showing orthogonal projections of mirror images of a single first planar coil of a second type and a second planar coil connected to the single first planar coil in series according to a first embodiment of the present disclosure.

As shown in FIG. 5A, the starting points of the first involute curve 31 and the second involute curve 32 coincide, the starting radius of the first involute curve 31 is the same as the starting radius of the second involute curve 32, the rotation number of the first involute curve 31 is less than the rotation number of the second involute curve 32, and the radius change rate of the first involute curve 31 is less than the radius change rate of the second involute curve 32.

Figure 5B:
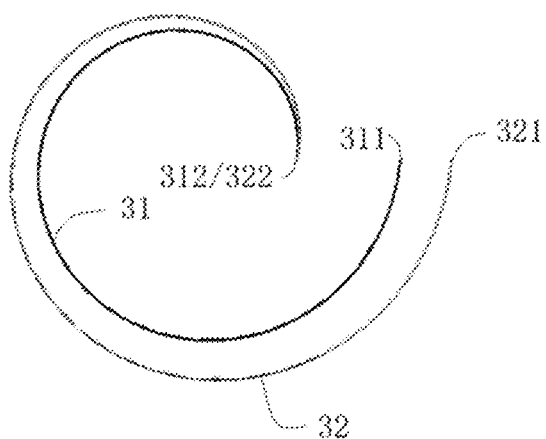
FIG. 5B illustrates a schematic diagram showing orthogonal projections of mirror images of a single first planar coil of a third type and a second planar coil connected to the single first planar coil in series according to a first embodiment of the present disclosure.

As shown in FIG. 5B, the starting points of the first involute curve 31 and the second involute curve 32 coincide, the starting radius of the first involute curve 31 is the same as the starting radius of the second involute curve 32, the rotation number of the first involute curve 31 is the same as the rotation number of the second involute curve 32, and the radius change rate of the first involute curve 31 is less than the radius change rate of the second involute curve 32.

Figure 5C:
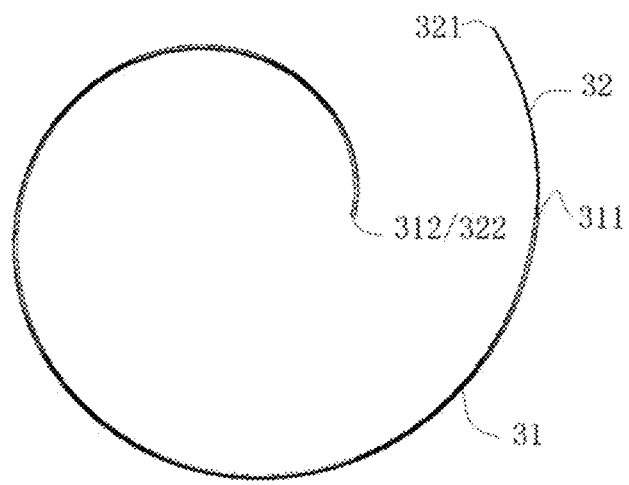
FIG. 5C illustrates a schematic diagram showing orthogonal projections of mirror images of a single first planar coil of a fourth type and a second planar coil connected to the single first planar coil in series according to a first embodiment of the present disclosure.

As shown in FIG. 5C, the starting points of the first involute curve 31 and the second involute curve 32 coincide, the starting radius of the first involute curve 31 is the same as the starting radius of the second involute curve 32, the radius change rate of the first involute curve 31 is the same as the radius change rate of the second involute curve 32, and the rotation number of the first involute curve 31 is less than the rotation number of the second involute curve 32.

Figure 5D:
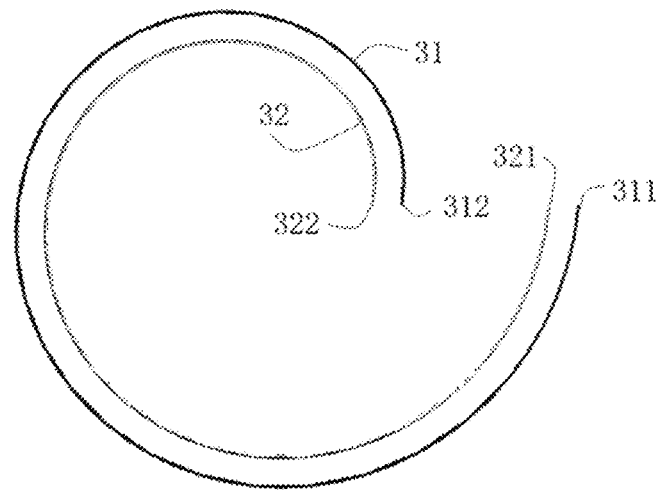
FIG. 5D illustrates a schematic diagram showing orthogonal projections of mirror images of a single first planar coil of a fifth type and a second planar coil connected to the single first planar coil in series according to a first embodiment of the present disclosure.

As shown in FIG. 5D, the starting points of the first involute curve 31 and the second involute curve 32 do not coincide, the radius change rate of the first involute curve 31 is the same as the radius change rate of the second involute curve 32, the rotation number of the first involute curve 31 is the same as the rotation number of the second involute curve 32, and the starting radius of the first involute curve 31 is the greater than the starting radius of the second involute curve 32.

Figure 6A:
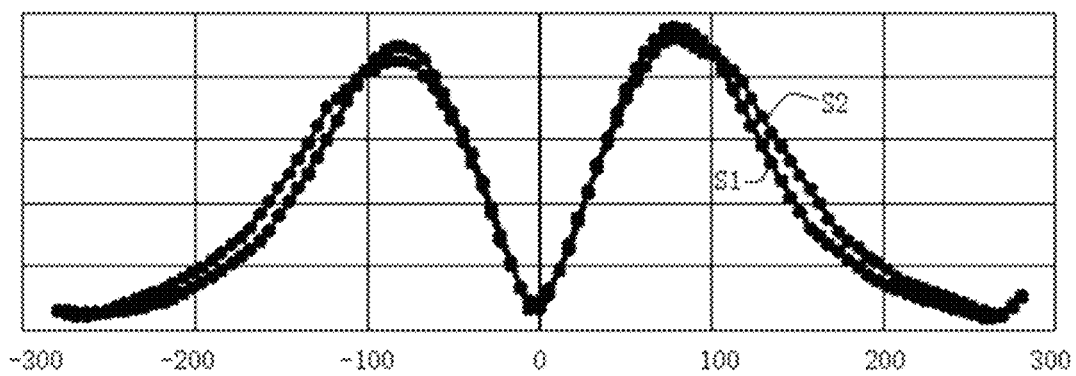
FIG. 6A illustrates a schematic comparison diagram showing a coupling energy distribution curve of the single first planar coil of the fourth type and the second planar coil when a coil turn number of the coil is different in FIG. 5C.

FIG. 6A illustrates a schematic comparison diagram showing a coupling energy distribution curve of the single first planar coil of the fourth type and the second planar coil when the coil turn number of the coil is different in FIG. 5C. The horizontal axis in FIG. 6A represents the radial radius of the reaction chamber (i.e., the radial direction of the coil set), and the vertical axis represents the magnitude of the coupling energy. Curve S1 represents the coupling energy curve formed below the first planar coil corresponding to the first involute curve 31, and curve S2 represents the coupling energy curve formed below the second planar coil corresponding to the second involute curve 32. As shown in FIG. 5C, the rotation number of the second involute curve 32 (0.9 turn) is larger than the rotation number of the first involute curve 31 (0.75 turn). In this case, the effective length of the second planar coil is greater than the length of the first planar coil. Thus, curve S2 has a larger coverage area than curve S1, and the coupling energy formed below the second planar coil can be larger than the coupling energy formed below the first planar coil. However, only the peak value of the coupling energy formed below the second planar coil is slightly reduced relative to the peak value of the coupling energy formed below the first planar coil. Thus, by increasing or reducing the rotation number of the involute curve of one of the first planar coil and the second planar coil connected to the first planar coil in series, i.e., the rotation number of the involute curve of one of the first planar coil and the second planar coil connected to the first planar coil in series being greater than or smaller than the rotation number of the involute curve of the other one of the first planar coil and the second planar coil connected to the first planar coil in series, the magnitude of the coupling energy formed below one of the first planar coil and the second planar coil connected to the first planar coil in series can be increased or reduced to compensate the difference in the current distribution. In practical applications, the rotation number of the involute curve of one of the first planar coil and the second planar coil connected to the first planar coil in series can be adjusted independently, or the rotation numbers of the involute curves of the first planar coil and the second planar coil connected to the first planar coil in series can be adjusted simultaneously.

In some embodiments, the change range of the rotation number of the involute curve of one of the first planar coil and the second planar coil connected to the first planar coil in series relative to the rotation number of the involute curve of the other one of the first planar coil and the second planar coil connected to the first planar coil in series can be greater than or equal to −5% and less than or equal to +12%, where the symbol "−" indicates a decrease, and the symbol "+" indicates an increase.

Figure 6B:
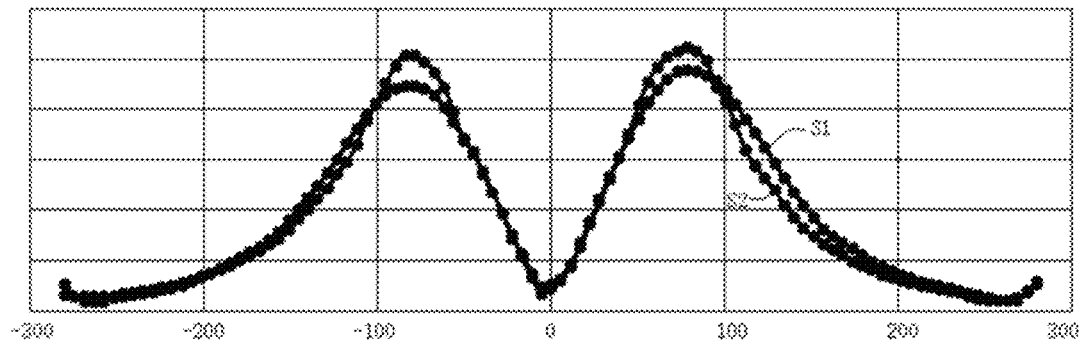
FIG. 6B illustrates a schematic comparison diagram showing a coupling energy distribution curve of the single first planar coil of the third type and the second planar coil when a radius change rate is different in FIG. 5B.

FIG. 6B illustrates a schematic comparison diagram showing a coupling energy distribution curve of the single first planar coil of the third type and the second planar coil in FIG. 5B when a radius change rate is different. The horizontal axis in FIG. 6B represents the radial radius of the reaction chamber, and the vertical axis represents the magnitude of the coupling energy. Curve S1 represents the coupling energy curve formed below the first planar coil corresponding to the first involute curve 31, and curve S2 represents the coupling energy curve formed below the second planar coil corresponding to the second involute curve 32. As shown in FIG. 5B, the radius change rate of the first involute curve 31 (70 mm/turn) is smaller than the radius change rate of the second involute curve 32 (90 mm/turn). In this case, relative to the second planar coil, the first planar coil will become more compact in the radial direction, which causes the density amplitude of the coupling energy formed below the first planar coil to be larger. As shown in FIG. 6B, the density amplitude of the coupling energy of curve S1 is greater than the density amplitude of the coupling energy of curve S2. Thus, by increasing or reducing the radius change rate of the involute curve of one of the first planar coil and the second planar coil connected to the first planar coil in series, i.e., the radius change rate of the involute curve of one of the first planar coil and the second planar coil connected to the first planar coil in series being greater than or smaller than the radius change rate of the involute curve of the other one of the first planar coil and the second planar coil connected to the first planar coil in series, the density amplitude of the coupling energy formed below one of the first planar coil and the second planar coil connected to the first planar coil in series can be reduced or increased to compensate the difference in the current distribution. In practical applications, the radius change rate of the involute curve of one of the first planar coil and the second planar coil connected to the first planar coil in series can be adjusted independently, or the radius change rates of the involute curves of the first planar coil and the second planar coil connected to the first planar coil in series can be adjusted simultaneously.

In some embodiments, the change range of the radius change rate of one of the involute curve of one of the first planar coil and the second planar coil connected in series relative to the radius change rate of one of the involute curve of the other one of the first planar coil and the second planar coil connected in series can be greater than or equal to −10% and less than or equal to +30%.

Figure 6C:
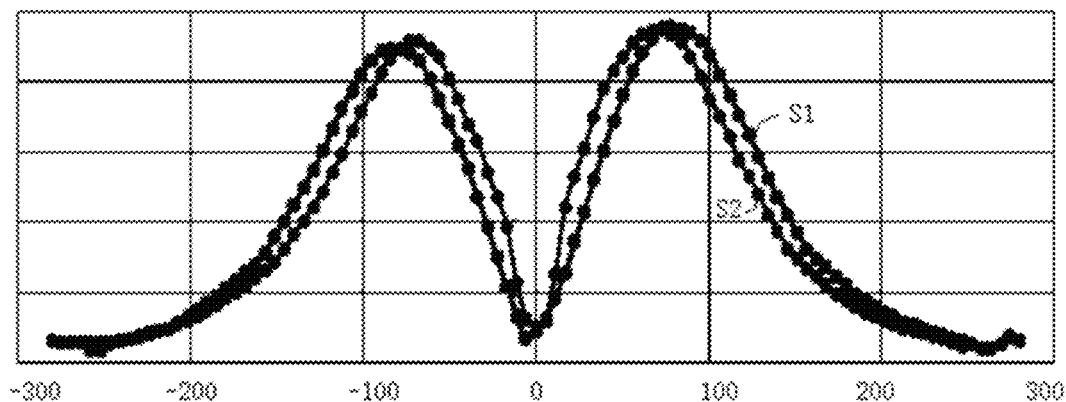
FIG. 6C illustrates a schematic comparison diagram showing a coupling energy distribution curve of the single first planar coil of the fifth type and the second planar coil when an initial radius is different in FIG. 5D.

FIG. 6C illustrates a schematic comparison diagram showing a coupling energy distribution curve of the single first planar coil of the fifth type and the second planar coil when an initial radius is different in FIG. 5D. The horizontal axis in FIG. 6C represents the radial radius of the reaction chamber, and the vertical axis represents the magnitude of the coupling energy. Curve S1 represents the coupling energy curve formed below the first-planar coil corresponding to the first involute curve 31, and curve S2 represents the coupling energy curve formed below the second planar coil corresponding to the second involute curve 32. As shown in FIG. 5D, the initial radius of the first involute curve 31 (150 mm) is greater than the initial radius of the second involute curve 32 (120 mm). In this case, when the initial radius of the involute curve is larger, the peak value of the coupling energy is closer to a position with the larger radial radius of the reaction chamber. Thus, the peak value of the coupling energy of curve S1 can be closer to the position with the larger radial radius of the reaction chamber relative to curve S2. Thus, by increasing or decreasing the initial radius of the involute curve of one of the first planar coil and the second planar coil connected to the first planar coil in series, i.e., the initial radius of the involute curve of one of the first-planar coil and the second-planar coil connected to the first planar coil in series being greater or less than the initial radius of the involute curve of the other one of the first planar coil and the second planar coil connected to the first planar coil in series, the peak value of the coupling energy formed below one of the first planar coil and the second planar coil connected to the first planar coil in series can move in a direction away from or close to the axis of the coil set along the radial direction of the coil set (i.e., the radial direction of the reaction chamber) to compensate the difference in the current distribution. In practical applications, the initial radius of the involute curve of one of the first planar coil and the second planar coil connected to the first planar coil in series can be adjusted independently, or the initial radiuses of the involute curves of the first planar coil and the second planar coil connected to the first planar coil in series can be adjusted simultaneously.

In some embodiments, the change range of the initial radius of the involute curve of one of the first planar coil and the second planar coil connected to the first planar coil in series relative to the initial radius of the involute curve of the other one of the first planar coil and the second planar coil connected to the first planar coil in series can be greater than or equal to −10% and less than or equal to +10%.

It should be noted that in practical applications, the first planar coil and the second planar coil can also have other shapes, such as an arc shape. In such cases, relevant parameters of the shapes can be adjusted according to features of different shapes, as long as the difference in current distribution can be compensated.

Second Embodiment

Figure 1:
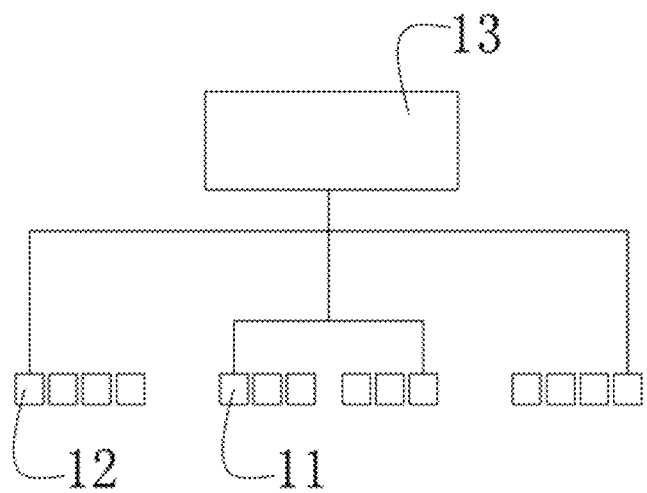
FIG. 1 illustrates a schematic diagram of a coil structure in the existing technology.
Figure 2:
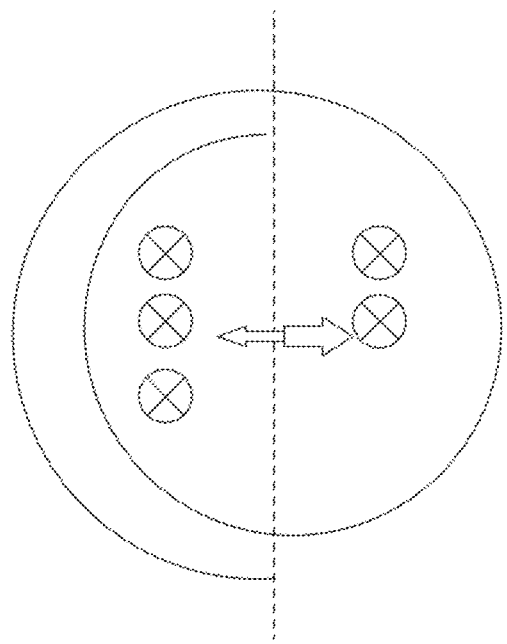
FIG. 2 illustrates a schematic diagram of an electromagnetic field in the existing technology.
Figure 7:
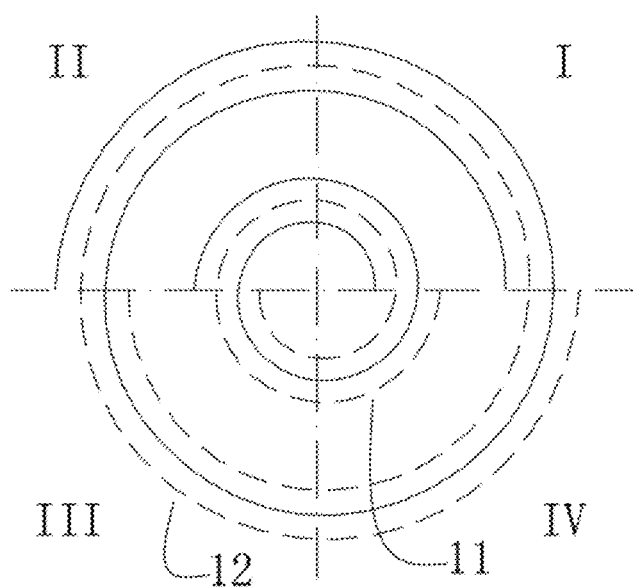
FIG. 7 illustrates a schematic diagram of a projection of the coil structure in FIG. 1 on a radial cross-section.

For the coil structure shown in FIG. 1, the orthogonal projection of the coil structure on the radial cross-section of the coil structure is asymmetric in the circumferential direction (i.e., angular direction). In some embodiments, as shown in FIG. 7, the radial cross-section is divided into four quadrant regions (I, II, III, IV). Since the radius gradually increases from the inner end to the outer end of the involute curve of each planar coil, the portions of the coil structure in first quadrant region I and third quadrant region III are obviously different from the portions of the coil structure in second quadrant region II and fourth quadrant region IV. Thus, the current distribution of the coil structure in the circumferential direction (i.e., angular direction) can be different to cause the distribution of the electromagnetic field to be ununiform. In the processing process, the density distribution of the free radicals and the ions can be asymmetric to cause the angular distribution of the plasma density to be uneven to affect the processing uniformity.

Figure 8:
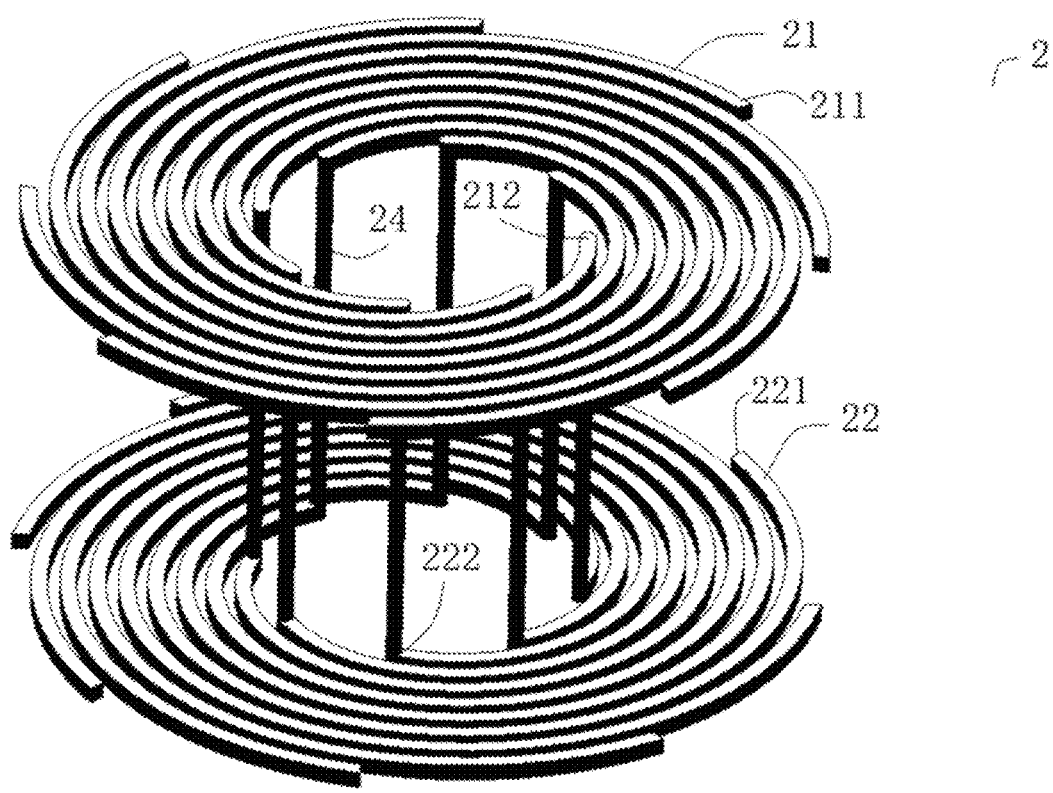
FIG. 8 illustrates a schematic structural diagram of a coil structure according to a second embodiment of the present disclosure.

To address the above technical issues, the coil structure of the present embodiment is improved based on the first embodiment. In some embodiments, as shown in FIG. 8, the first sub-coil set includes a plurality of first planar coils 21 in the first plane. The plurality of first planar coils 21 have the same shape and are arranged at intervals from each other. The first ends 211 of the plurality of first planar coils 21 are distributed uniformly along the circumferential direction of the coil set. The second ends 212 of the plurality of first planar coils 21 are distributed uniformly along the circumferential direction of the coil set. That is, the plurality of first planar coils can be arranged according to different rotation angles along the circumferential direction. After any one first planar coil of the first planar coils 21 is rotated a certain angle clockwise or counterclockwise along the circumferential direction of the coil set, the first planar coil can coincide with the other neighboring first planar coil 21. The second sub-coil set includes the plurality of second planar coils 22. The plurality of second planar coils 22 have the same shape and are arranged at intervals from each other. The first ends of the plurality of second planar coils 22 are distributed uniformly along the circumferential direction of the coil set. The second ends of the plurality of second planar coils 22 are distributed uniformly along the circumferential direction of the coil set. That is, the plurality of second planar coils 22 can be arranged according to different rotation angles along the circumferential direction. After any one second planar coil 22 of the second planar coils 22 is rotated a certain angle clockwise or counterclockwise along the circumferential direction of the coil set, the second planar coil can coincide with the other neighboring second planar coil 22. Moreover, the plurality of first planar coils 21 can be in a one-to-one correspondence with the plurality of second planar coils 22. The first ends 211 of the plurality of first planar coils 21 can be connected in parallel. The first ends 221 of the plurality of second planar coils 22 can be connected in parallel. The second ends 212 of the plurality of first planar coils 21 can be connected to the second ends 222 of the plurality of second planar coils 22 in series.

Figure 9A:
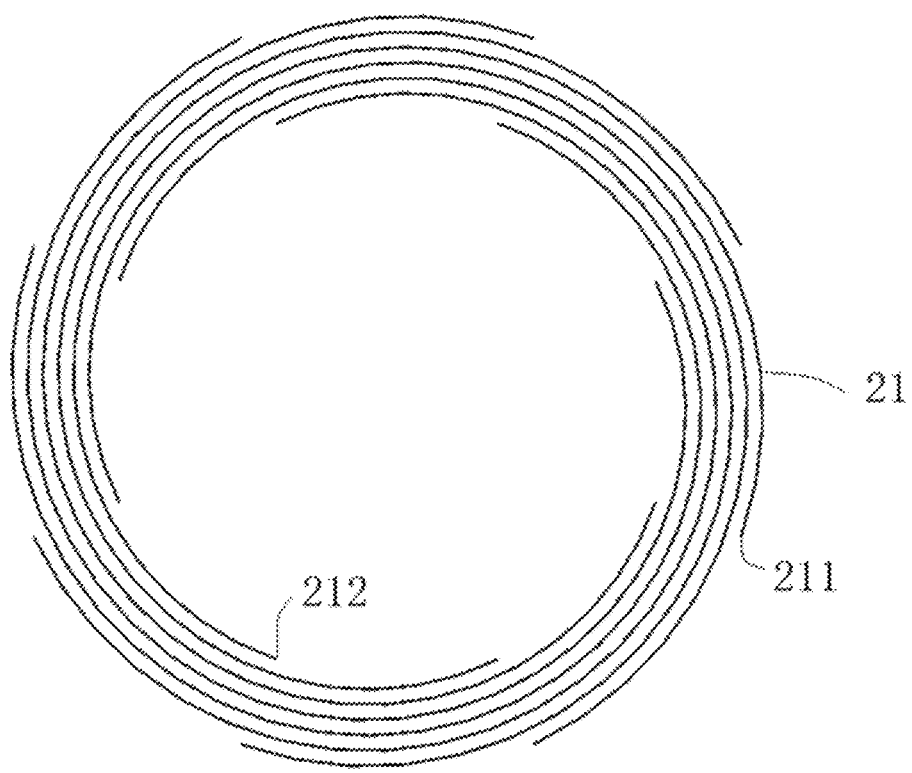
FIG. 9A illustrates a schematic diagram showing an orthogonal projection of a first sub-coil set on the first plane according to a third embodiment of the present disclosure.

In some embodiments, as shown in FIG. 9A, taking the plurality of first planar coils 21 as an example, the plurality of first planar coils 21 have the same shape, e.g., the involute shape, In the first ends 211 of the plurality of first planar coils 21, the first ends 211 of any two neighboring first planar coils 21 can have an interval in the circumferential direction of the coil set. That is, the first ends 211 of any one first planar coil 21 can coincide with the first end 211 of the other neighboring first planar coil 21 after being rotated clockwise or counterclockwise a certain angle around the axis of the coil set (a central angle corresponding to the interval). Since the plurality of first planar coils 21 have the same shape, any one first planar coil 21 can coincide with the other neighboring first planar coil 21 after being rotated clockwise or counterclockwise around the axis of the coil set. For example, FIG. 9A shows 8 first planar coils 21. Thus, any one first planar coil 21 can coincide with the other neighboring first planar coil 21 after being rotated 45° clockwise or counterclockwise around the axis of the coil set.

Since the plurality of first planar coils 21 have the same shape and are distributed uniformly along the circumferential direction of the coil set, the plurality of first planar coils 21 can be angular symmetric along the circumferential direction of the coil set. That is, the coil set can be symmetric in the circumferential direction to avoid the difference in the current distribution in the circumferential direction to improve the uniformity of the angular distribution of the plasma density to improve the processing uniformity.

When more first planar coils 21 are provided in the same coil set, the angular symmetry of the projection of the plurality planar coils 21 on the first plane can be better, which is more beneficial to improve the symmetry of the angular distribution of the plasma density. In some embodiments, the number of the first planar coils 21 can be greater than or equal to 6 and smaller than or equal to 10.

Similar to the first planar coils 21, the plurality of second-planar coils 22 can be arranged in the second plane and have the same shape, e.g., involute shape. The plurality of second-planar coils 22 can also have angular symmetry in the circumferential direction of the coil set to avoid the difference in the current distribution in the circumferential direction. Thus, the uniformity of the angular distribution of the plasma density can be improved, and the processing uniformity can be improved.

Moreover, the first ends 221 of the plurality of second planar coils 22 are connected in parallel, and the second ends 212 of the plurality of first planar coils 21 are connected in series with the second ends 222 of the plurality of second planar coils 22. In this case, one of the first ends 221 of the plurality of second planar coils 22 or the first ends 211 of the plurality of first planar coils 21 can be used as RF feed in ends electrically connected to the output end of the RF source, and the other one of the first ends 221 of the plurality of second planar coils 22 or the first ends 211 of the plurality of first planar coils 21 can be used as RF feed out ends electrically connected to the input end of the RF source.

Figure 9B:
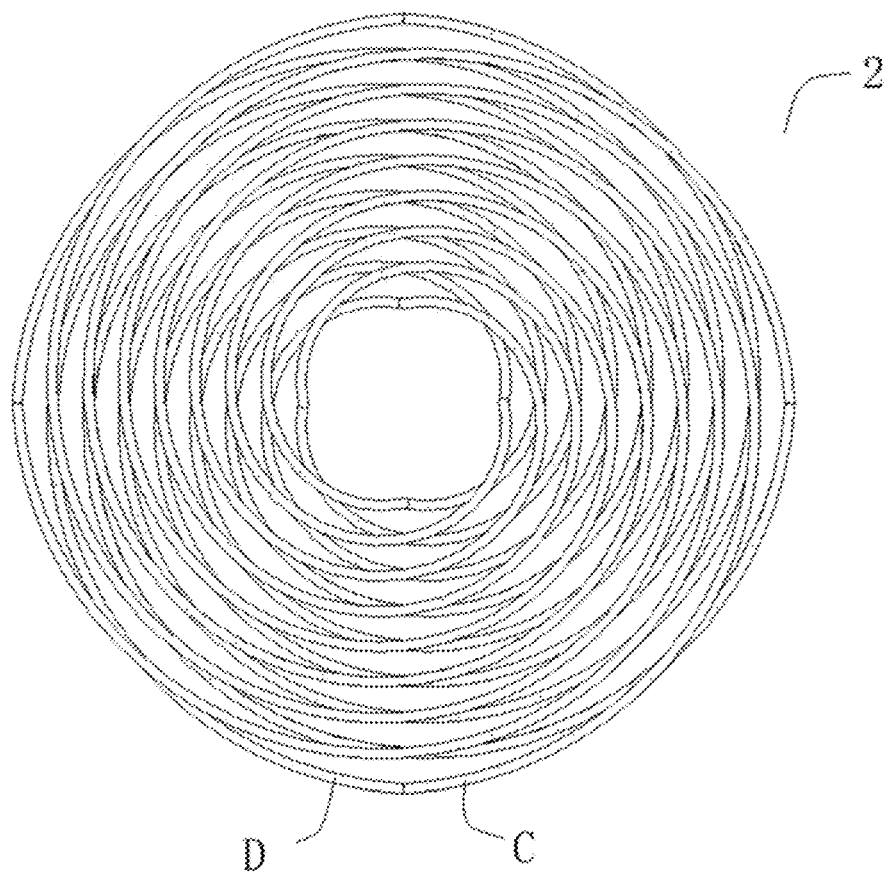
FIG. 9B illustrates a schematic diagram showing orthogonal projections of a first sub-coil set and a second sub-coil set on the first plane according to a third embodiment of the present disclosure.

As shown in FIG. 9B, the orthogonal projection formed by the first sub-coil set consisting of the plurality of first planar coils 21 on the first plane is third projection C. The orthogonal projection formed by the second sub-coil set consisting of the plurality of second planar coils 22 on the second plane is fourth projection D. The third projection and the fourth projection can be mirror-symmetric or mirror-asymmetric. Thus, in addition to the plurality of first planar coils 21 and the plurality of second planar coils 22 being angular symmetric in the circumferential direction of the coil set, the magnetic fields and electric fields generated by the first sub-coil set and the second sub-coil set can compensate with each other. Thus, the total magnetic field and the total electric field of the first sub-coil set and the second sub-coil set can be mirror-symmetric to compensate for the difference in the current distribution of the coils in the radial direction. Thus, the distribution uniformity of the coupling energy generated below the coil in the radial direction can be improved to improve the distribution uniformity of the density of the free radicals and the ions of the plasma in the radial direction.

Figure 10A:
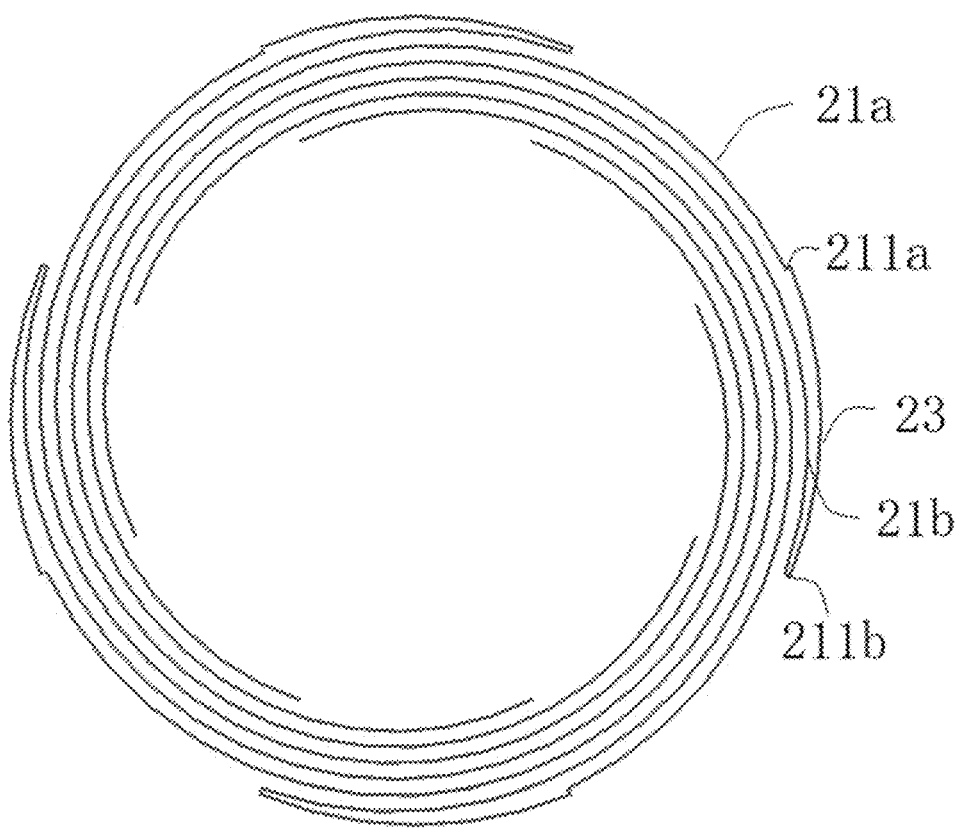
FIG. 10A illustrates a schematic diagram showing an orthogonal projection of first ends of a plurality of first planar coils connected in parallel in the coil structure in FIG. 9A.
Figure 10B:
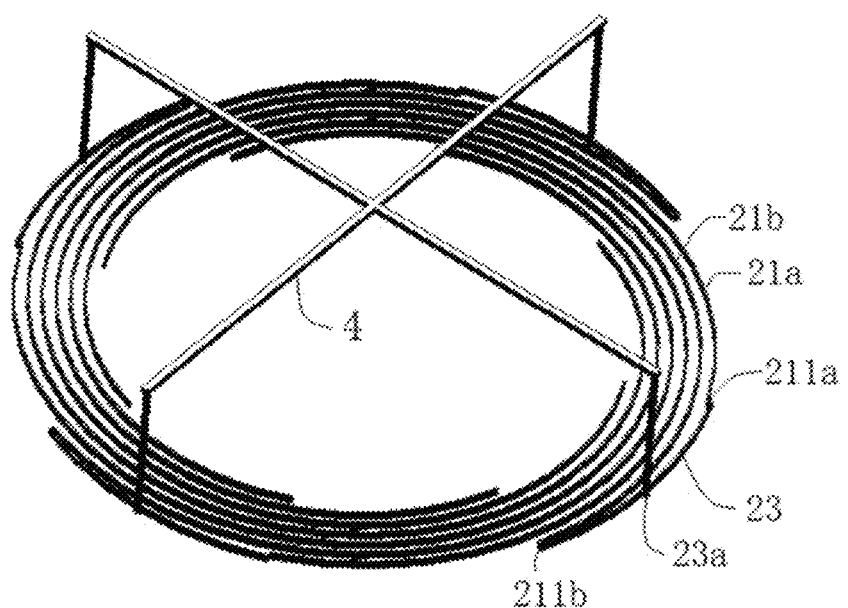
FIG. 10B illustrates a schematic perspective diagram of first ends of a plurality of first planar coils connected in parallel in the coil structure in FIG. 9A.

In some embodiments, a plurality of methods of connecting the first ends 211 of the plurality of first planar coils 21 in parallel and connecting the first ends 221 of the plurality of second planar coils 22 in parallel can be provided. For example, as shown in FIG. 10A and FIG. 10B, by taking the first ends 211 of the plurality of first planar coils 21 connected in parallel as an example, assume that N first planar coils 21 is provided, where N is an even number greater than or equal to 2, for example, greater than or equal to 6 and smaller than or equal to 10. As shown in FIG. 10A, N=8. N first planar coils 21 are divided into N/2 first coil pairs along the circumferential direction of the coil set. For example, 8 first planar coils 21 in FIG. 10A is divided into 4 first coil pairs (two in a pair). Each first coil pair includes two neighboring first planar coils (21a, 21b), and a first extension segment 23 connects between first ends (211a, 211b) of the two neighboring first planar coils (21a, 21b) to connect the first ends (211a, 211b) in parallel. As shown in FIG. 10B, the first extension segments 23 of the N/2 first coil pairs are connected in parallel through the connection structure 4.

In some embodiments, as shown in FIG. 10B, a middle point of each first extension segment 23 is used as an RF feed in point or an RF feed out point. Thus, the two neighboring first planar coils (21a, 21b) can be ensured to have the same length, and the current flowing through the first planar coils (21a, 21b) can have the same path.

The methods of connecting the first ends 221 of the plurality of second planar coils 22 in parallel can be the same as the methods of connecting the first ends 211 of the plurality of first planar coils 21 in parallel. In some embodiments, N second planar coils 22 can be provided. The N second planar coils 22 can be divided into N/2 second coil pairs in the circumferential direction of the coil set. Each second coil pair can include two neighboring second planar coils 22, and a second extension segment can connect between the first ends 221 of the two neighboring second planar coils 22 to connect the first ends 221 in parallel. The second extension segments of the N/2 second coil pairs can be connected in parallel.

It needs to be noted that the method of connecting the first ends 221 of the plurality of second planar coils 22 in parallel and the method of connecting the first ends 211 of the plurality of first planar coils 21 can adopt any other method. For example, the first ends 211 of the plurality of first planar coils 21 can be directly connected in parallel, and the first ends 221 of the plurality of second planar coils 22 can be directly connected in parallel.

In some embodiments, various methods of connecting the second ends 212 of the plurality of first planar coils 21 to the second ends 222 of the plurality of second planar coils 22 in series can be provided. For example, as shown in FIG. 8, a connection segment 24 connects between the second end 212 of each first planar coil 21 and the second end 222 of the corresponding second planar coil 22 to connect the second end 212 and the second end 222 in series. The extension direction of the connection segment 24 can be parallel with the axis of the coil set.

Figure 11:
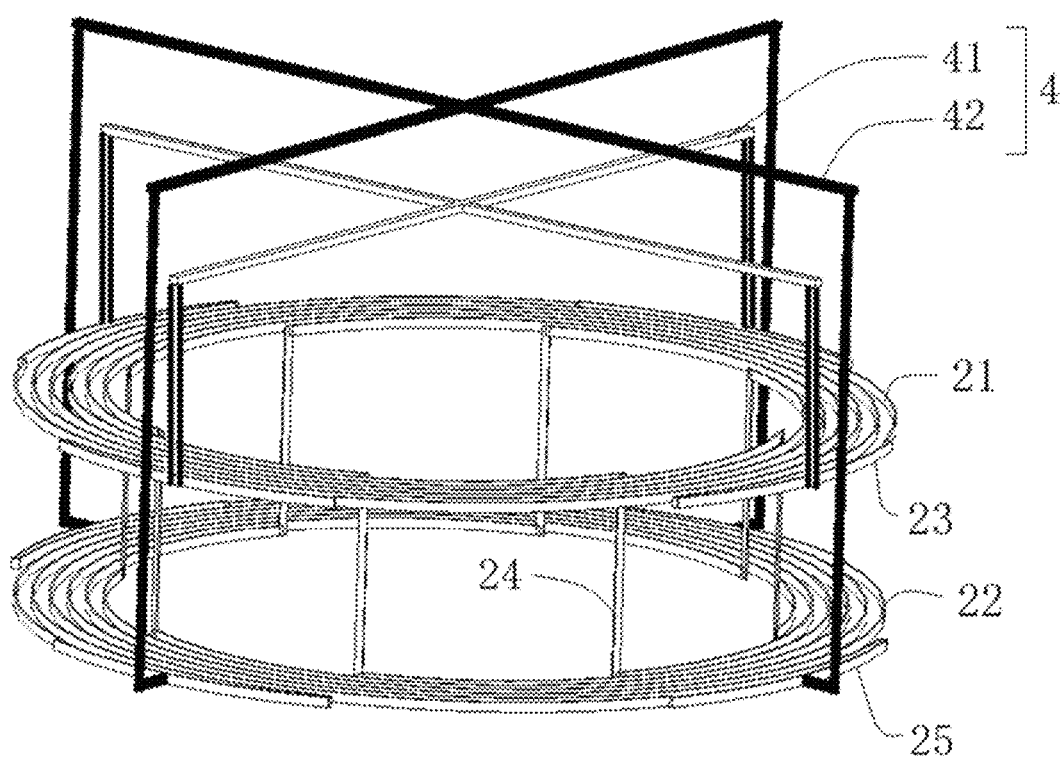
FIG. 11 illustrates a schematic perspective diagram showing electrical connections between a plurality of first planar coils and a plurality of second planar coils in the coil structure in FIG. 8.

In some embodiments, as shown in FIG. 11, one coil set is provided. The coil set includes a first sub-coil set and a second sub-coil set, and the first sub-coil set and the second sub-coil set are arranged at an interval along the axis of the coil set. The first sub-coil set includes the plurality of first planar coils 21 in the first plane. The second sub-coil set includes the plurality of second planar coils 22 in the second plane parallel to the first parallel. Moreover, different first extension segments 23 of the first sub-coil set can be connected in parallel through the first connectors 41 of the connection structure 4. Different second extension segments 25 of the second sub-coil set can be connected in parallel through the second connectors 42 in the connection structure 4. The second end of each first planar coil 21 can be connected to the second end of the second planar coil 22 in series through the connection segment 24. One of the first connector 41 and the second connector 42 can be configured to be electrically connected to an input end of the RF source, and the other one of the first connector 41 and the second connector 42 can be configured to be electrically connected to the output end of the RF source.

Figure 12:
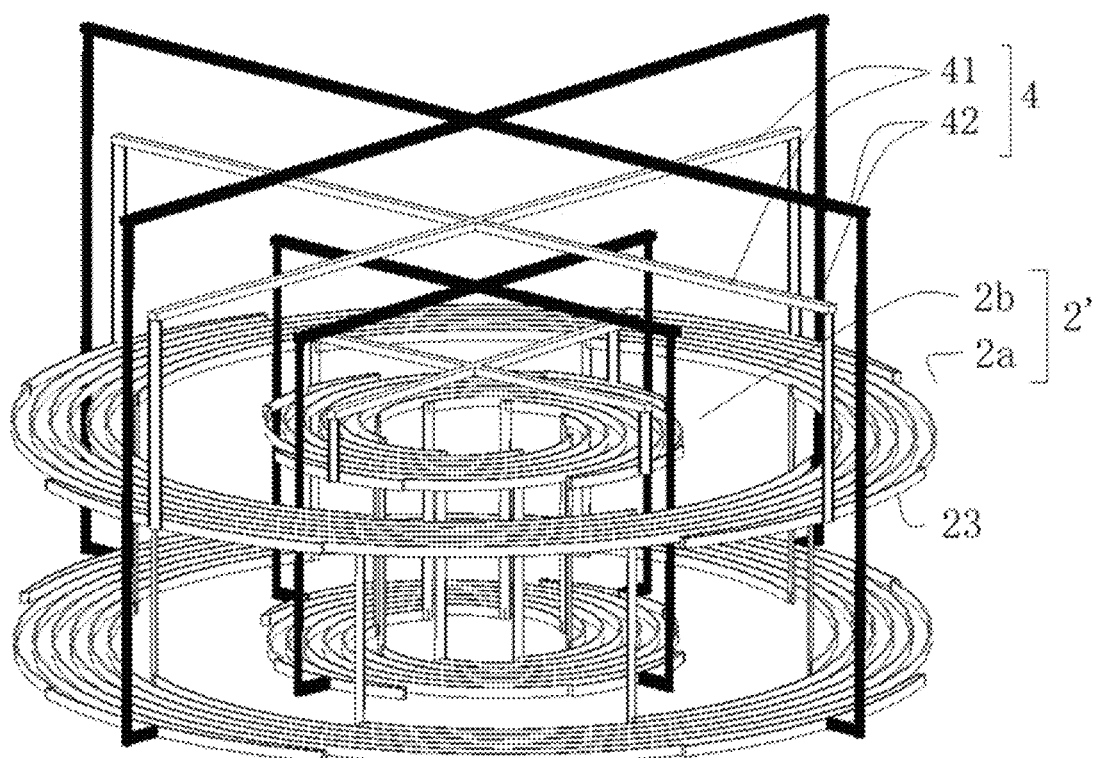
FIG. 12 illustrates a perspective diagram of another coil structure according to a second embodiment of the present disclosure.

In some embodiments, FIG. 12 shows another coil structure 2'. Compared to the coil structure 2, the difference between the coil structure 2' and the coil structure 2 includes that the coil structure 2' includes two coil sets (2a, 2b), and the two coil sets (2a, 2b) have different dimensions and are nested with each other. The two coil sets (2a, 2b) are arranged at positions of the circumferences with different radiuses of the reaction chamber of the semiconductor processing equipment, respectively. For example, coil set 2a is arranged around the outer periphery of coil set 2b. The two coil sets (2a, 2b) correspond to the central area and edge area of the reaction chamber, respectively. Thus, the distribution uniformity of the plasma in the radial direction of the reaction chamber can be improved. Of course, in practical applications, three or more than four coil sets can be provided, which is not limited in the present embodiment.

In summary, the coil structure of the present disclosure for generating the plasma in the semiconductor processing equipment can include at least one coil set. The coil set can include the first sub-coil set and the second sub-coil set that are coaxially arranged. The first sub-coil set can include at least one first planar coil located in the first plane. The second sub-coil set can include at least one second planar coil located in the second plane parallel to the first plane. The first-planar coil can be connected in series with the second-planar coil. The orthogonal projection of the second-planar coil on the first plane can be mirror-symmetric or mirror-asymmetric to the first-planar coil. By making the orthogonal projection of the second-planar coil on the first plane mirror-symmetric or mirror-asymmetric to the first-planar coil, the magnetic fields and the electric fields generated by the first sub-coil set and the second sub-coil set can compensate for each other. Thus, the distribution of the total magnetic field and the total electric field can be mirror-symmetric to compensate for the difference in the current distribution in the radial direction and the angular direction of the coil. The distribution uniformity of the coupling energy generated below the coil can be improved, and the distribution uniformity of the density of the free radicals and ions of the plasma can be improved.

Third Embodiment

Figure 13:
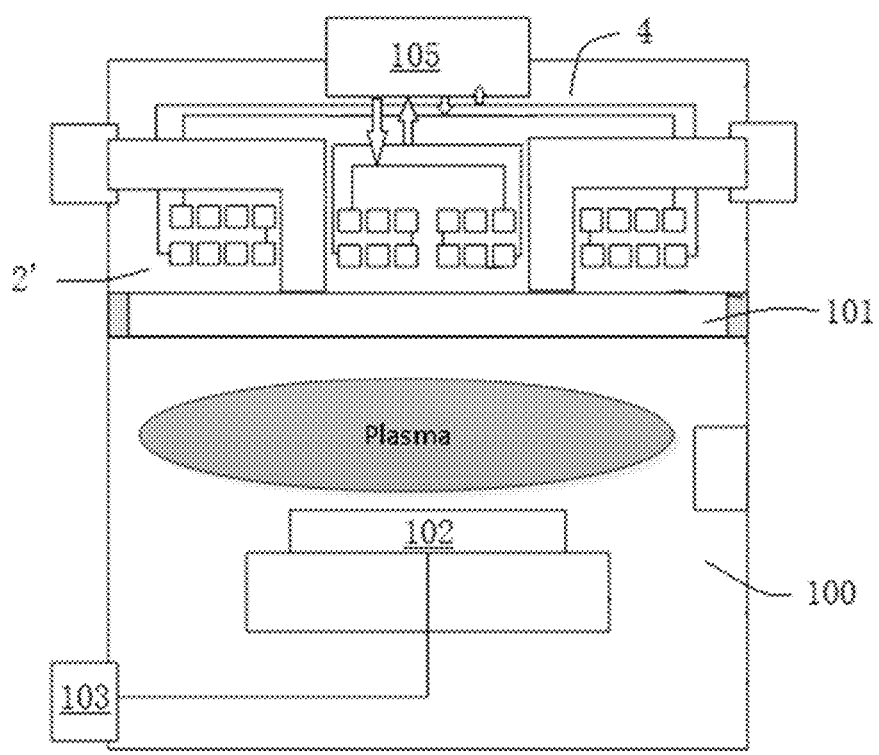
FIG. 13 illustrates a schematic structural diagram of semiconductor processing equipment according to a third embodiment of the present disclosure.

As another technical solution, embodiments of the present disclosure also provide semiconductor processing equipment. For example, as shown in FIG. 13, the semiconductor processing equipment includes an RF source 105 of an upper electrode, a reaction chamber 100, and a coil structure 2'. A dielectric window 101 is arranged at the top of the reaction chamber 100. The coil structure 2' is arranged above the dielectric window 101. The coil structure 2' can adopt the coil structure of various embodiments of the present disclosure, for example, using the coil structure 2' shown in FIG. 12.

The RF source 105 can be configured to provide RF power to the coil structure 2' to excite the process gas in the reaction chamber 100 to form plasma. The RF source 105 includes an RF power source and an adapter or includes only the RF power source. In addition, a base 102 is arranged in the reaction chamber 100 to support the wafer. The base 102 is electrically connected to an RF source 103 of a lower electrode. The RF source 103 can be configured to apply an RF bias voltage to the base 102 to attract the plasma toward the wafer surface.

In some embodiments, the coil structure can adopt the coil structure in the second embodiment, for example, the coil structure shown in FIG. 11 or FIG. 12. Thus, the semiconductor processing equipment further includes a connection structure 4. The connection structure 4 includes a first connector 41 and a second connector 42. The first connector 41 can be electrically connected to the first ends 211 of the plurality of first-planar coils 21 in the first sub-coil set to connect the first ends 211 of the plurality of first-planar coils 21 in parallel. The second connector 42 can be configured to electrically connect the first ends 221 of the plurality of second-planar coils 22 in the second sub-coil set to connect the first ends 221 of the plurality of second planar coils 22 in parallel. Moreover, one of the first connector 41 and the second connector 42 can be electrically connected to the input end of the RF source 105, and the other one of the first connector 41 and the second connector 42 can be electrically connected to the output end of the RF source 105.

In some embodiments, the coil structure can adopt the coil structure shown in FIG. 11 or FIG. 12. In this case, as shown in FIG. 11 and FIG. 12, the first connector 41 includes N/2 first connection bars, for example, FIG. 11 and FIG. 12 show 4 first connection bars. One end of each first connection bar of the N/2 first connection bars can be electrically connected to a first extension segment 23 of the N/2 first coil pairs. The other end of each of the N/2 first connection bars can converge and be electrically connected at a first height position above the first plane. The convergence position can be used as a connection position electrically connected to the input end or the output end of the RF source 105.

Similarly, the second connector 42 can include N/2 second connection bars. One end of each of the N/2 second connection bars can be electrically connected to a second extension segment 25 of the N/2 pairs of second-planar coils. The other end of each of the N/2 second connection bars can converge and be electrically connected at a second height position above the first plane. The second height position can have a height difference from the first height position to ensure that the first connector 41 does not contact the second connector 42.

In some embodiments, the midpoint of each first extension segment 23 can be used as an RF feed-in point or RF feed-out point. The midpoint of each second extension segment 25 can be used as an RF feed-out point or RF feed-in point. Thus, the two neighboring first planar coils 21 can be ensured to have the same length as the two neighboring second planar coils 22. Thus, the path for the current flowing through the first planar coils 21 and the path for the current flowing through the second planar coils 22 can be the same.

By adopting the coil structure of the present disclosure, the semiconductor processing equipment of the present disclosure can be configured to compensate for the current distribution of the coil in the radial direction and improve the distribution uniformity of the coupling energy generated below the coil in the radial direction to improve the distribution uniformity of the density of the free radicals and ions of the plasma in the radial direction.

It is understood that the above embodiments are merely illustrative embodiments adopted to explain the principles of the present disclosure. However, the present disclosure is not limited to this. For those skilled in the art, various modifications and improvements can be made without departing from the spirit and essence of the present disclosure. Such modifications and improvements are also within the scope of the present disclosure.

What is claimed is:

1. A coil structure configured to generate plasma in semiconductor processing equipment comprising at least one coil set including:
    a first sub-coil set including at least one first planar coil located in a first plane; and
    a second sub-coil set coaxially arranged with the first sub-coil set, and including at least one second planar coil located in a second plane parallel to the first plane; wherein:
        the first planar coil and the second planar coil is connected in series;
        an orthogonal projection of the second planar coil on the first plane is mirror-asymmetric to the first planar coil; and
        mirror refers to that an orthogonal projection of the first planar coil on the first plane and the orthogonal projection of the second planar coil on the first plane have same or similar shape and opposite arrangement directions, asymmetric refers to that a shape of a front side of one of the orthogonal projection of the first planar coil on the first plane and the orthogonal projection of the second planar coil on the first plane is similar to a shape of a back side of the orthogonal projection of the first planar coil on the first plane and the orthogonal projection of the second planar coil on the first plane, but some parameters are different.

2. The coil structure according to claim 1, wherein:
    the first sub-coil set includes a plurality of first planar coils-having a same shape and arranged at intervals from each other, first ends of the plurality of first planar coils being uniformly distributed along a circumferential direction of the coil set, and second ends of the plurality of first planar coils being uniformly distributed along the circumferential direction of the coil set;
    the second sub-coil set includes a plurality of second planar coils-having a same shape and arranged at intervals from each other, first ends of the plurality of second planar coils being uniformly distributed along a circumferential direction of the coil set, and second ends of the plurality of second planar coils being uniformly distributed along the circumferential direction of the coil set; and
    the plurality of first planar coils are in a one-to-one correspondence with the plurality of second planar coils, the first ends of the plurality of first planar coils are connected in parallel, the first ends of the plurality of second planar coils are connected in parallel, and the second ends of the plurality of first planar coils are connected to the second ends of the plurality of second planar coils in series in a one-to-one correspondence.

3. The coil structure according to claim 1, wherein:
    the axial distance between the first sub-coil set and the second sub-coil set is greater than the determined axial distance.

4. The coil structure according to claim 3, wherein the determined axial distance is 5 mm.

5. The coil structure according to claim 1, wherein the axial distance between the first sub-coil set and the second sub-coil set ranges from greater than or equal to 4 mm to less than or equal to 20 mm.

6. The coil structure according to claim 1, wherein shapes of the first-planar coil and the second-planar coil are both involute shapes.

7. The coil structure according to claim 6, wherein:
    at least one of a starting radius, a rotation number, or a radius change rate in involute curves of the first planar coil and the second planar coil connected to the first planar coil in series is different.

8. The coil structure according to claim 7, wherein:
    a rotation number of an involute curve of one of the first planar coil and the second planar coil connected to the first planar coil in series is greater than or smaller than a rotation number of an involute curve of the other one of the first planar coil and the second planar coil to increase or reduce an amplitude of the coupling energy generated below the first planar coil and the second planar coil; and/or
    a radius change rate of the involute curve of one of the first planar coil and the second planar coil connected to the first planar coil in series is greater than or smaller than a radius change rate of the involute curve of the other one of the first planar coil and the second planar coil to increase or reduce a density amplitude of the coupling energy generated below the first planar coil and the second planar coil; and/or
    a starting radius of the involute curve of one of the first planar coil and the second planar coil connected to the first planar coil in series is greater than or smaller than a starting radius of the involute curve of the other one of the first planar coil and the second planar coil to cause a peak value of the coupling energy generated below the first planar coil and the second planar coil to move away from or close to an axis of the coil set along a radial direction of the coil set.

9. The coil structure according to claim 8, wherein:
    a change range of the rotation number of the involute curve of one of the first planar coil and the second planar coil connected to the first planar coil in series relative to the rotation number of the involute curve of the other one of the first planar coil and the second planar coil is greater than or equal to −5% and smaller than or equal to +12%;
    a change range of the radius change rate of the involute curve of one of the first planar coil and the second planar coil connected to the first planar coil in series relative to the radius change rate of the involute curve of the other one of the first planar coil and the second planar coil is greater than or equal to −10% and smaller than or equal to +30%; and
    a change range of the starting radius of the involute curve of one of the first planar coil and the second planar coil connected to the first planar coil in series relative to the starting radius of the involute curve of the other one of the first planar coil and the second planar coil is greater than or equal to −10% and smaller than or equal to +10%.

10. The coil structure according to claim 2, wherein:
    N first planar coils are provided-and divided into N/2 first coil pairs along the circumferential direction of the coil set, N being an even number greater than or equal to 2, each first coil pair including two neighboring first planar coils, a first extension segment connecting between first ends of the two neighboring first planar coils to connect the first ends in parallel, and first extension segments of the N/2 first coil pairs being connected in parallel; and N second planar coils are provided-and divided into N/2 second coil pairs along the circumferential direction of the coil set, each second coil pair including two neighboring second planar coils, a second extension segment connecting between first ends of the two neighboring second planar coils to connect the first ends in parallel, and second extension segments of the N/2 second coil pairs being connected in parallel.

11. The coil structure according to claim 10, wherein N is greater than or equal to 6 and less than or equal to 10.

12. The coil structure according to claim 2, wherein a connection segment connects between a second end of each first planar coil and a second end of a corresponding second planar coil to connect the second ends in series, and an extension direction of the connection segment is parallel to an axis of the coil set.

13. The coil structure according to claim 1, wherein the coil set includes a plurality of coil sets-having different sizes and being nested with each other.

14. Semiconductor processing equipment, comprising:
   an RF source configured to provide RF power to the coil structure;
   a reaction chamber, a dielectric window being arranged at a top of the reaction chamber;
   a coil structure including at least one coil set, including:
      a first sub-coil set including at least one first planar coil located in a first plane; and
      a second sub-coil set coaxially arranged with the first sub-coil set and including at least one second planar coil located in a second plane parallel to the first plane;
   wherein:
      the first planar coil and the second planar coil is connected in series;
      an orthogonal projection of the second planar coil on the first plane is mirror-asymmetric to the first planar coil; and
      mirror refers to that an orthogonal projection of the first planar coil on the first plane and the orthogonal projection of the second planar coil on the first plane have same or similar shape and opposite arrangement directions, asymmetric refers to that a shape of a front side of one of the orthogonal projection of the first planar coil on the first plane and the orthogonal projection of the second planar coil on the first plane is similar to a shape of a back side of the orthogonal projection of the first planar coil on the first plane and the orthogonal projection of the second planar coil on the first plane, but some parameters are different.

15. The semiconductor processing equipment according to claim 14, further comprising a connection structure, including:
   a first connector electrically connected to first ends of a plurality of first planar coils in the first sub-coil set; and
   a second connector electrically connected to first ends of a plurality of second planar coils in the second sub-coil set;
   wherein:
      one of the first connector and the second connector is electrically connected to an input end of the RF source; and
      the other one of the first connector and the second connector is electrically connected to an output end of the RF source.

16. The semiconductor processing equipment according to claim 15, wherein:
   the first connector includes N/2 first connection bars, one end of each of the N/2 first connection bars is electrically connected to a corresponding first extension segment of the N/2 first coil pairs, and the other end of each of the N/2 first connection bars converges and is electrically connected at a first height position above the first plane; and
   the second connector includes N/2 second connection bars, one end of each of the N/2 second connection bars is electrically connected to a corresponding second extension segment of the N/2 second-planar coil pairs, the other end of each of the N/2 second connection bars converges and is electrically connected at a second height position above the first plane, and a height difference exists between the second height position and the first height position.

17. The semiconductor processing equipment according to claim 16, wherein:
   one end of each first connection bar is electrically connected to a midpoint of a corresponding first extension segment; and
   one end of each second connection bar is electrically connected to a midpoint of a corresponding second extension segment.

* * * * *